United States Patent [19]
Saito

[11] Patent Number: 6,002,278
[45] Date of Patent: Dec. 14, 1999

[54] VARIABLE FREQUENCY DIVIDER AND PLL CIRCUIT

[75] Inventor: Shinji Saito, Kasugai, Japan

[73] Assignee: Fujitsu Limited, Kawasaki, Japan

[21] Appl. No.: 09/017,051

[22] Filed: Jan. 27, 1998

[30] Foreign Application Priority Data

May 28, 1997 [JP] Japan ................................. 9-138522

[51] Int. Cl.$^6$ ................................................. H03K 21/00
[52] U.S. Cl. ............................. 327/115; 327/117; 377/47
[58] Field of Search .................................. 327/115, 117, 327/118, 158, 160; 377/47, 48

[56] References Cited

U.S. PATENT DOCUMENTS 4,296,407  10/1981  Minakuchi ............................. 327/115
4,628,269  12/1986  Hunninghaus et al. ............... 327/115
4,803,437  2/1989   Reusens ................................. 327/115

FOREIGN PATENT DOCUMENTS 5-122065  5/1993  Japan.

Primary Examiner—Kenneth B. Wells
Attorney, Agent, or Firm—Staas & Halsey

[57] ABSTRACT

A PLL circuit having a variable frequency divider circuit includes a timing circuit which ensures that data provided to a comparison counter circuit is stable before initiating a counting operation, which prevents the counter circuit from generating erroneous data.

9 Claims, 4 Drawing Sheets

VARIABLE FREQUENCY DIVIDER AND PLL CIRCUIT

BACKGROUND OF THE INVENTION

The present invention relates to a variable frequency divider and a PLL circuit, and more particularly to a PLL circuit which generates an output signal frequency consistent with a set frequency.

In recent years, PLL circuits have been used in mobile communication equipments, such as mobile and portable telephones. In such a PLL circuit, the output signal frequency must be switched swiftly into a desired frequency in order to improve usefulness of the mobile communication equipment. Recently, a time-sharing frequency switching system has been adopted to make effective use of the frequency. In such a system, it is especially important that the output signal frequency of the PLL circuit is switched in a fast rate and a short period.

FIG. 1 illustrates a first example of a conventional PLL circuit. A shift register circuit 1 receives serial data SD in accordance with the rise of a clock signal CLK. The shift register circuit 1 then provides, for example, a 10 bits of parallel data for setting a frequency dividing ratio to a latch circuit 2. The latch circuit 2 latches the parallel data in accordance with the rise of a latch signal LE and provides a frequency dividing ratio setting signal DLH to a comparison counter circuit 3. The comparison counter circuit 3 divides the frequency of an input signal IN on the basis of the frequency dividing ratio set by the frequency dividing ratio setting signal DLH, and provides a frequency dividing signal LD to a phase comparator 4, as a comparison signal. At the same time, the comparison counter circuit 3 receives a frequency dividing signal LD, as a load signal.

The phase comparator 4 receives the frequency dividing signal LD and a reference signal REF supplied from a reference frequency divider (not shown). The phase comparator 4 then compares the frequency dividing signal LD and the reference signal REF, and outputs a pulse signal corresponding to the difference in frequency and the difference in phase to a charge pump 5. A pull-up side transistor or pull-down side transistor of the output stage of the charge pump 5 is turned on in accordance with the pulse signal outputted from the phase comparator 4. The charge pump 5 has a loop filter 6 on the subsequent stage as a load, and increases the output voltage as the pull-up side transistor goes on and decreases the output voltage as the pull-down side transistor goes on. The loop filter 6 functions as the load of the charge pump 5, and smooths the output signal of the charge pump 5 to output a smoothed output signal to a voltage controlled oscillator (VCO) 7. The VCO 7 outputs an output signal of a frequency corresponding to an output voltage of the loop filter 6. The output signal is an input to the comparison counter circuit 3.

FIG. 2 is a block diagram of the latch circuit 2 and the comparison counter circuit 3 of FIG. 1. The latch circuit 2 comprises a plurality of D flip flop circuits 8. Each of the flip flop circuits 8 receives the parallel data output from the shift register 1. Each of the flip flop circuits 8 also receives the latch signal LE and latches the parallel data in accordance with the rise of the latch signal LE and output the frequency dividing ratio setting signals DLH.

The comparison counter circuit 3 comprises a plurality of flip flop circuits 9 connected in series. Each of the flip flop circuits 9 receives the signal DLH at its data input, and the first stage flip flop circuit 9 receives the input signal IN at its clock input CK. The signal DLH is latched by each of the flip flop circuits 9 in accordance with the input of the frequency dividing signal LD. Each output signal of the flip flop circuits 9 is input to an AND gate 10, which outputs the frequency dividing signal LD.

The comparison counter circuit 3 counts up the pulse number of input signals IN, using a value set in each of the flip flop circuits 9 by the frequency dividing ratio setting signal DLH as a count start value. When all of the output signals from the flip flop circuits 9 are high, a count-up operation is completed, and the AND gate 10 outputs an H level frequency dividing signal LD having a time length corresponding to one cycle of the input signal IN. When the H level frequency dividing signal LD is input to each of the flip flop circuits 9, the frequency dividing ratio is reset in each of the flip flop circuits 9, and the count-up operation resumes in accordance with the new frequency dividing ratio.

Referring now to FIG. 3, each time the clock signal CLK is input to the shift register 1, the shift register 1 outputs the parallel data. Then, when the latch circuit 2 receives the latch signal LE, the latch circuit 2 latches the parallel data in accordance with the rise of the latch signal LE and outputs the frequency dividing ratio setting signal DLH. Accordingly, the frequency dividing ratio setting signal DLH is switched in accordance with the rise of the latch signal LE. When the comparison counter circuit 3 outputs a frequency dividing signal LD, in accordance with the frequency dividing signal LD, a new frequency dividing ratio setting signal DLH is received by the comparison counter circuit 3, and a new counting operation is initiated.

However, in operation, the clock signal CLK and latch signal LE are asynchronous with the input signal IN of the comparison counter circuit 3. Accordingly, the switching of the frequency dividing ratio setting signal DLH is asynchronous with the frequency dividing signal LD. Accordingly, if the fall of the frequency dividing signal LD overlaps a time t1 required for switching the frequency dividing ratio setting signal DLH, the frequency dividing ratio setting signal DLH received by the comparison counter circuit 3 is not stable. Therefore, a normal frequency dividing ratio is not set in the comparison counter circuit 3, thereby inviting a risk of malfunction.

FIG. 4 illustrates a second example of a conventional PLL circuit which prevents the aforementioned malfunction of the comparison counter circuit. The same parts as those of the first example will be described with the same numerals. A first latch circuit 2a is supplied with the parallel data and the latch signal LE. The first latch circuit 2a latches the parallel data, in accordance with the latch signal LE, and outputs a first frequency dividing ratio setting signal DLH1 to a second latch circuit 2b. The second latch circuit 2b receives the first frequency dividing ratio setting signal DLH1 and a latch signal LEC. The second latch circuit 2b latches the signal DLH1, in accordance with the latch signal LEC, and outputs a second frequency dividing ratio setting signal DLH2 to the comparison counter circuit 3. The comparison counter circuit 3 generates the frequency dividing signal LD, as previously discussed.

The frequency dividing signal LD is provided to a load timing control circuit 11. The load timing control circuit 11 comprises flip flop circuits 12a to 12c and an AND gate 13. The flip flop circuit 12a receives the frequency dividing signal LD as data D and the input signal IN as a clock signal CK. The flip flop circuit 12a then outputs a latched output signal L1 in accordance with the rise of the input signal IN. The flip flop circuit 12b receives the output signal L1 as data D and the input signal IN as a clock signal CK. The flip flop circuit 12b then outputs a latched output signal L2 in accordance with the rise of the input signal IN. The flip flop circuit 12c receives the output signal L1 as a clock signal CK and the latch signal LE as data D. The flip flop circuit 12c then outputs a latched output signal L3 in accordance with the rise of the output signal L1. The AND gate 13 receives the output signals L2, L3 and outputs a latch signal LEC.

The operation of the PLL circuit thus constructed will be described with reference to FIG. 5. When the switching of the first frequency dividing ratio setting signal DLH1 overlaps the falling of the frequency dividing signal LDa, the output signal L3 is kept in the L level depending on the timing of the output signal L1 and the latch signal LE, and the output of the latch signal LECa, based on the frequency dividing signal LDa, is interrupted. As the result, the comparison counter circuit 3 normally receives the frequency dividing ratio setting signal DLH1, which prevents malfunction of the comparison counter circuit 3.

Specifically, when the latch signal LE is input to the first latch circuit 2a, the signal DLH1 switches in accordance with the rise of the latch signal LE. The comparison counter circuit 3 outputs a frequency dividing signal LDa that falls from high to low while the signal DLH1 switches. The frequency dividing signal LDa rises, thereafter the output signal L1a from the flip flop circuit 12a rises in accordance with the rise of the input signal IN. The frequency dividing signal LDa falls, thereafter the output signal L1a falls in accordance with the rise of the input signal IN. Therefore, the output signal L1a is in phase with the signal LDa and has a specific delay time. The delay time is set so that the output signal L1a rises prior to the latch signal LE. When the output signal L1a rises, the latch signal LE is still low. Therefore, the output signal L3 of the flip flop circuit 12c is kept low. When the output signal L1a rises, and thereafter the input signal IN rises, the output signal L2a rises. When the output signal L1 falls, and thereafter the input signal IN rises, the output signal L2 falls. Therefore, the output signal L2 is in phase with the output signal L1 and has a specific delay time.

When the output signal L2 goes high, since the output signal L3 is kept in low, the latch signal LEC is kept low. Accordingly, the second latch circuit 2b does not receive the signal DLH1, and the signal DLH2 does not switch.

When the frequency dividing signal LDb rises, while the latch signal LE is kept high, the output signals L1b, L2b are output with a specific delay time in the same manner as the output signals L1a, L2a. The output signal L3 rises in accordance with the rise of the output signal L1b, when the latch signal LE is kept high. When the output signal L1c rises in accordance with the rise of the next frequency dividing signal LDc, if the latch signal LE is low, the output signal L3 falls. Since the output signal L2b is high while the output signal L3 is low, the AND gate 13 outputs the latch signal LEC in phase with the output signal L2b.

The second latch circuit 2b latches the signal DLH1 in accordance with the latch signal LEC and outputs the second frequency dividing ratio setting signal DLH2. Accordingly, the signal DLH2 is switched. The comparison counter circuit 3 receives the signal DLH2 in accordance with the next frequency dividing signal LDc, and starts to count the input signal IN in accordance with a frequency dividing ratio set by the second frequency dividing ratio setting signal DLH2.

If the latch signal LE rises and thereafter the frequency dividing signal LDb rises, the latch signal LEC is generated, and the signal DLH2 is switched in accordance with the latch signal LEC.

In the second conventional example, when the frequency dividing signal LDb rises while the latch signal LE is high, the latch signal LEC goes high so that the latched second frequency dividing ratio setting signal DLH2 switches.

Then, the comparison counter circuit 3 receives the signal DLH2 in accordance with the rise of the next cycle frequency dividing signal Ldc. The comparison counter circuit 3 receives the signal DLH2 after the first frequency dividing ratio setting signal DLH1 is switched by the latch signal LE, which takes some time for switching the frequency dividing ratio.

When the rising of the latch signal LE and the falling of the frequency dividing signal LDa overlap, the latch signal LECa is masked, and the signal DLH2 is switched in accordance with the next frequency dividing signal LDb. The comparison counter circuit 3 receives the signal DLH2 in accordance with the rise of the next frequency dividing signal Ldc. That is, the signal DLH1 is switched by the latch signal LE and then the signal DLH2 is not received by the comparison counter until the rise of LDc. Therefore, it takes still more time for switching the frequency dividing ratio, and thus, the switching of the output signal frequency in the PLL circuit requires extra time.

Further, in order to generate the latch signal LEC in accordance with the rise of the frequency dividing signal LD after the latch signal LE rises and the first frequency dividing ratio setting signal DLH1 is switched, the latch signal LE necessarily takes a longer time than one cycle of the frequency dividing signal LD. That is, the switching cycle of the first frequency dividing ratio setting signal DLH1 takes a time more than about two cycles of the frequency dividing signal LD. Therefore, the switching cycle of the frequency dividing ratio of the comparison counter circuit 3 requires a time more than about two cycles of the frequency dividing signal LD. Consequently, the switching period of the output signal frequency in the PLL circuit becomes longer.

It is an object of the present invention is to provide a PLL circuit capable of switching the output signal frequency in a fast rate and a short period.

SUMMARY OF THE INVENTION

Briefly stated, the present invention provides a variable frequency divider including: a latch circuit for latching a parallel signal in accordance with a first latch signal to output a frequency dividing ratio setting signal; a comparison counter circuit, coupled to the latch circuit, for dividing an input signal and outputting a frequency dividing signal in accordance with a frequency dividing ratio based on the frequency dividing ratio setting signal, wherein the comparison counter circuit starts a frequency dividing operation in accordance with a new frequency dividing ratio based on the frequency dividing ratio setting signal in response to the output frequency dividing signal; and a timing control circuit, coupled to the comparison counter circuit, for receiving the frequency dividing signal and a second latch signal and for generating the first latch signal, wherein the timing control circuit stops outputting the first latch signal from a time at which the comparison counter circuit begins outputting the frequency dividing signal to a time at which the comparison counter circuit ends outputting the frequency dividing signal.

The present invention further provides a PLL circuit including: a phase comparator for comparing a phase of frequency dividing signal to a phase of a reference signal and outputting a phase comparison signal; a charge pump, coupled to the phase comparator, for converting the phase comparison signal into a voltage signal; a loop filter, coupled to the charge pump, for smoothing the voltage signal thereby generating a smoothed voltage signal; a voltage controlled oscillator (VCO), coupled to the loop filter, for generating a frequency output signal corresponding to the smoothed output voltage signal; and a variable frequency divider, coupled between the phase comparator and the voltage controlled oscillator, for dividing a frequency of the frequency output signal in accordance with a set frequency dividing ratio to provide the frequency dividing signal to the phase comparator. The variable frequency divider includes: a latch circuit for latching a parallel signal in accordance with a first latch signal and outputting a frequency dividing ratio setting signal; a comparison counter circuit, coupled to the latch circuit, for dividing the frequency output signal and outputting the frequency dividing signal in accordance with a frequency dividing ratio based on the frequency dividing ratio setting signal, wherein the comparison counter circuit starts a frequency dividing operation in accordance with a new frequency dividing ratio based on the frequency dividing ratio setting signal in response to the output frequency dividing signal; and a timing control circuit, coupled to the comparison counter circuit, for receiving the frequency dividing signal and a second latch signal and for generating the first latch signal, wherein the timing control circuit stops outputting the first latch signal from a time at which the comparison counter circuit begins outputting the frequency dividing signal to a time at which the comparison counter circuit ends outputting the frequency dividing signal.

The present invention provides a variable frequency divider comprising: a latch circuit for latching a parallel signal in accordance with a first latch signal to output a frequency dividing ratio setting signal; a comparison counter circuit, coupled to the latch circuit, for dividing an input signal and outputting a frequency dividing signal in accordance with a frequency dividing ratio based on the frequency dividing ratio setting signal, wherein the comparison counter circuit starts a frequency dividing operation in accordance with a new frequency dividing ratio based on the frequency dividing ratio setting signal in response to the output frequency dividing signal; and a timing control circuit, coupled to the comparison counter circuit, for receiving the frequency dividing signal and a second latch signal and for generating the first latch signal, wherein the timing control circuit delays the output of the first latch signal when a transition period of the frequency dividing signal and a transition period of the second latch signal overlap.

Other aspects and advantages of the invention will become apparent from the following description, taken in conjunction with the accompanying drawings, illustrating by way of example the principles of the invention.

BRIEF DESCRIPTION OF THE DRAWINGS

The present invention will become more fully understood from the detailed description given herein below and the accompanying drawings which are given by way of illustration only, and thus are not limitative of the present invention and wherein.

DETAILED DESCRIPTION OF THE PREFERRED EMBODIMENTS

Figure 1:
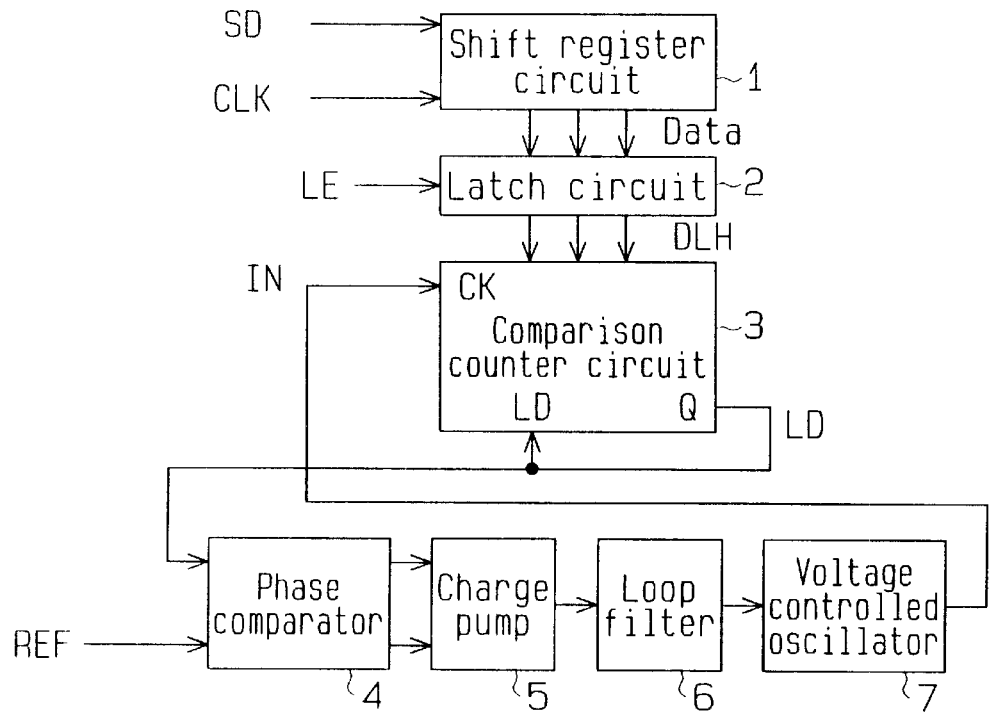
FIG. 1 is a schematic block diagram showing a first conventional PLL circuit.
Figure 2:
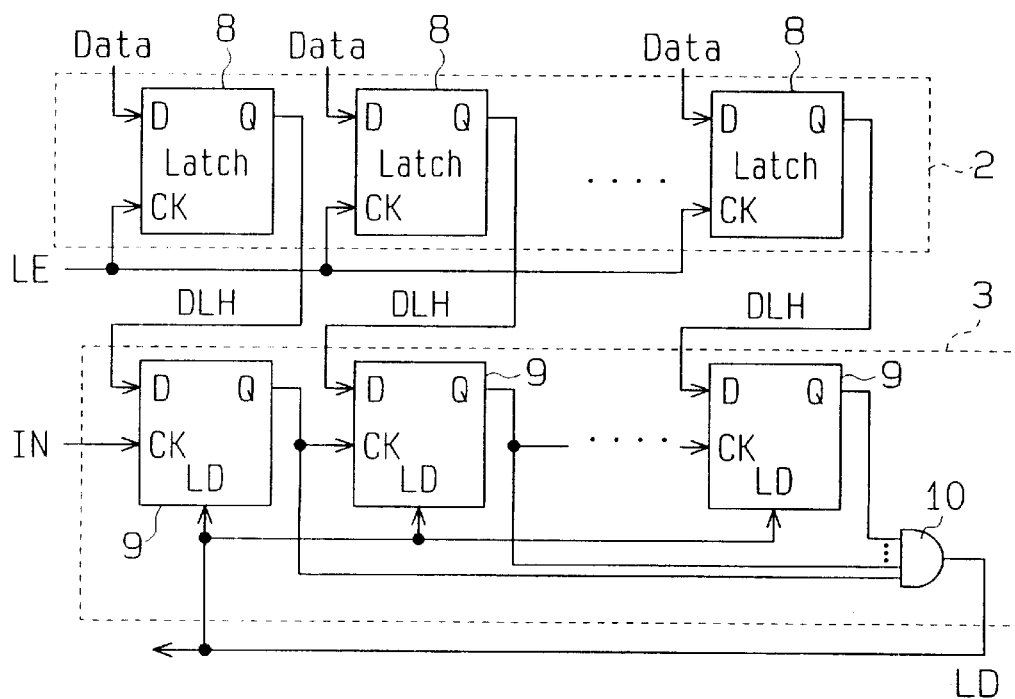
FIG. 2 is a circuit diagram showing a latch circuit and a comparison counter circuit of the PLL circuit of FIG. 1.
Figure 3:
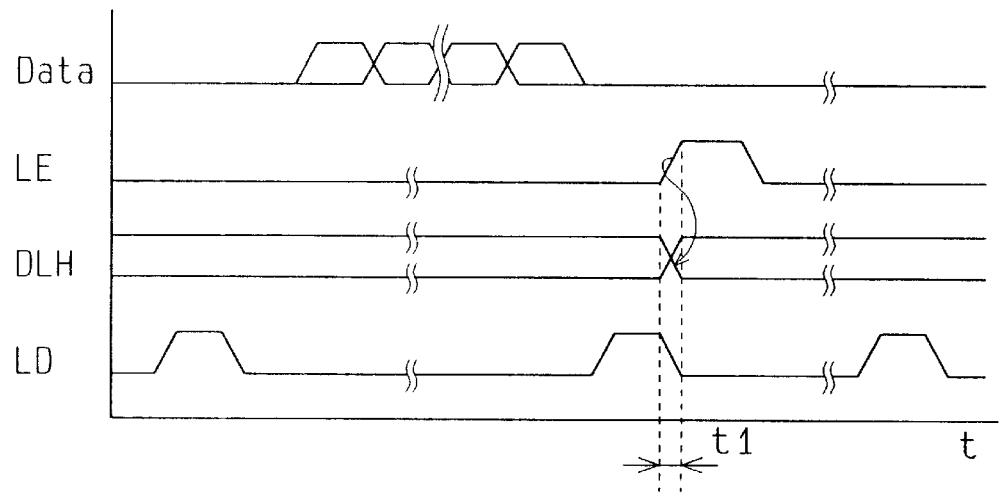
FIG. 3 is a timing chart showing the operation of the PLL circuit of FIG. 1.
Figure 4:
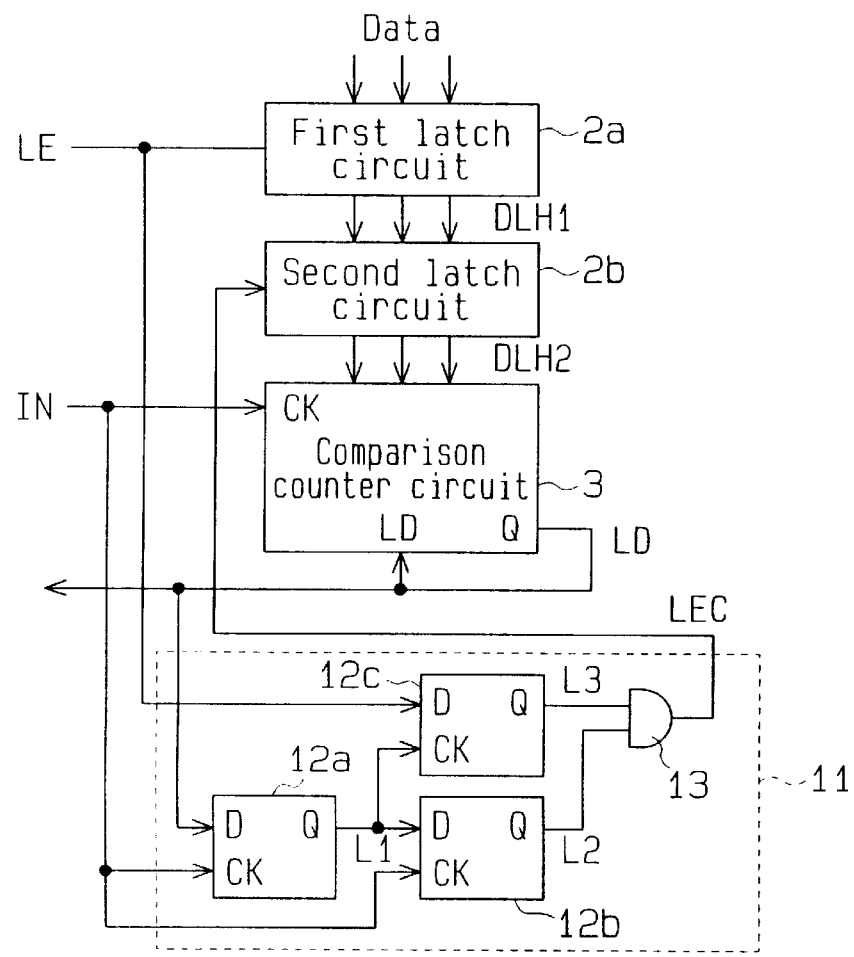
FIG. 4 is a block diagram showing a second conventional PLL circuit.
Figure 5:
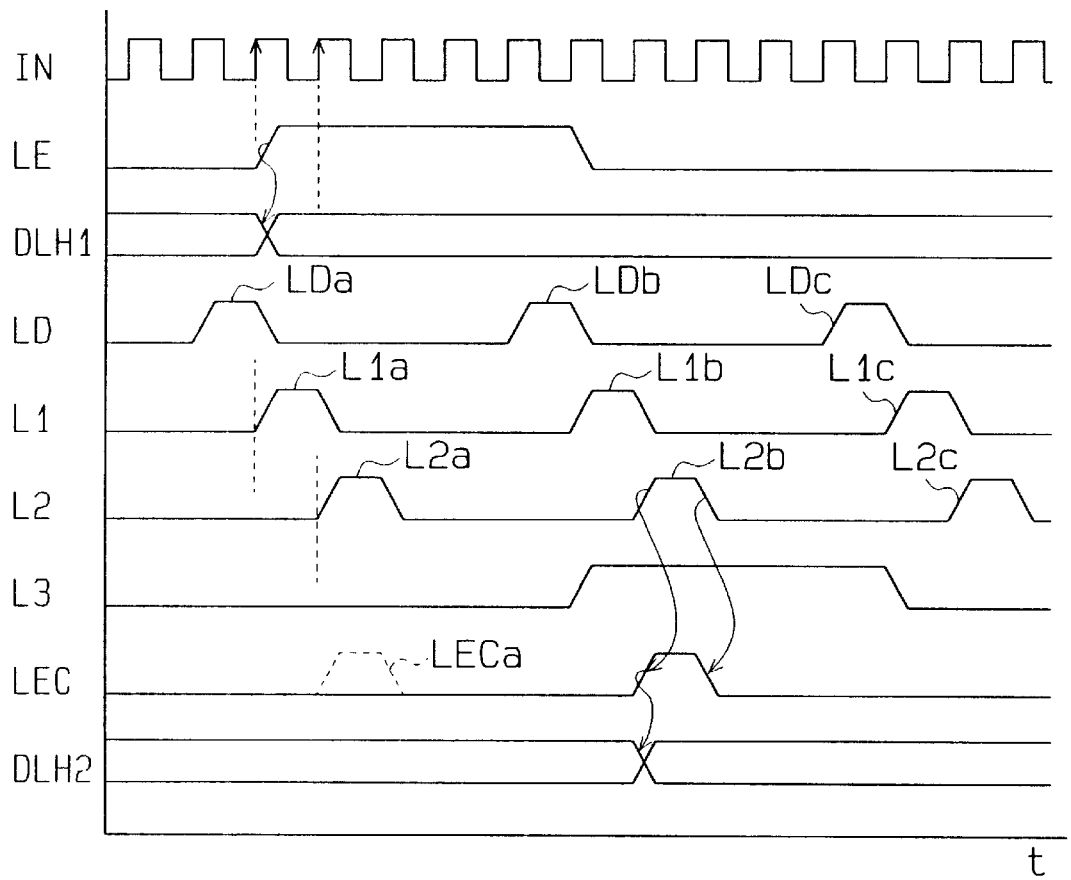
FIG. 5 is a timing chart showing the operation of the PLL circuit of FIG. 4.
Figure 6:
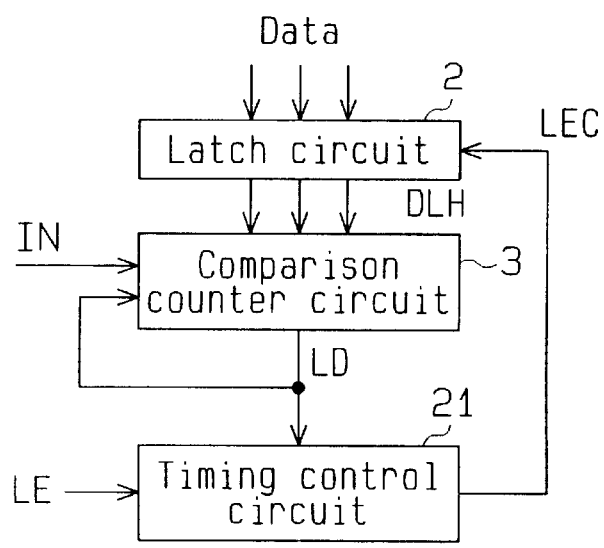
FIG. 6 is a schematic block diagram of a variable frequency divider according to the present invention.

FIG. 6 is a block diagram of a variable frequency divider according to the present invention. A latch circuit 2 latches a parallel data signal input from an external device (not shown) in accordance with a latch signal LEC to provide a frequency dividing ratio setting signal DLH to a comparison counter circuit 3. The comparison counter circuit 3 divides the frequency of an input signal IN and outputs a frequency dividing signal LD At the same time, the comparison counter circuit 3 starts the frequency dividing operation with a new frequency dividing ratio based on the signal DLH in response to the frequency dividing signal LD generated by the comparison counter circuit 3. A timing control circuit 21 generates the latch signal LEC in accordance with a latch signal LE received from an external device and the frequency dividing signal LD, and provides the latch signal LEC to the latch circuit 2. The timing control circuit 21 stops providing the latch signal LEC during a state transition period when the comparison counter circuit 3 starts to output the frequency dividing signal LD until the comparison counter circuit 3 finishes outputting the signal LD.

Figure 7:
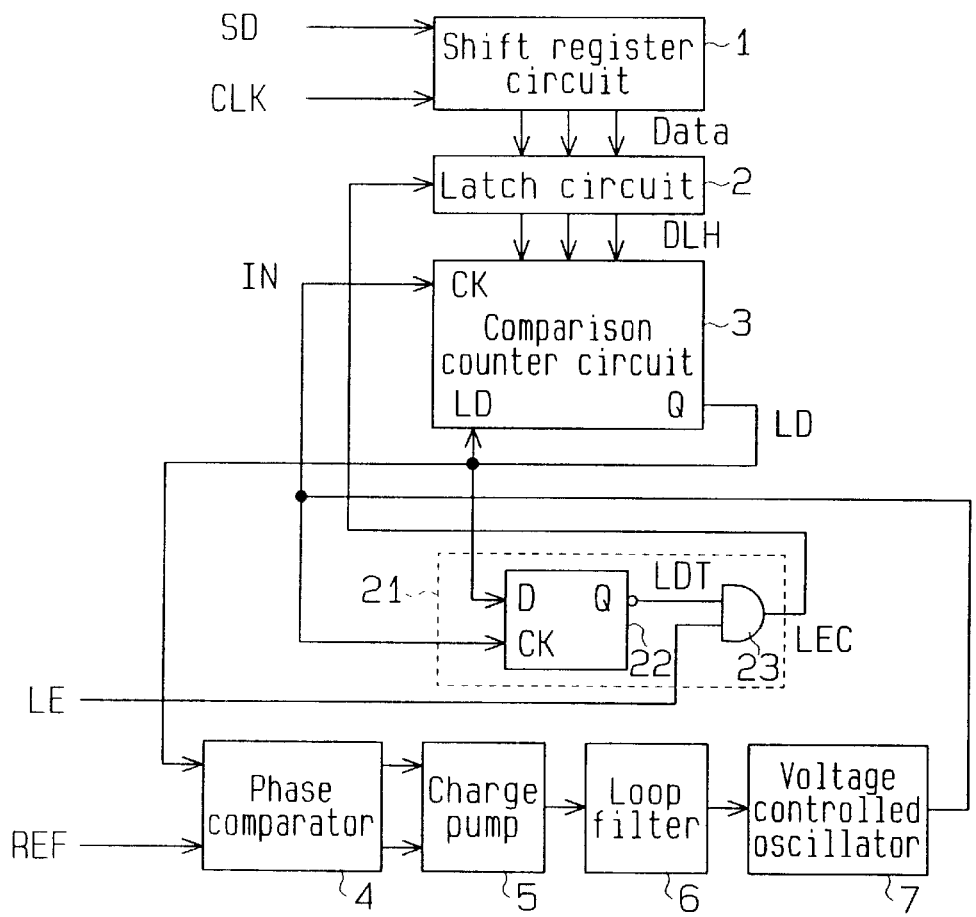
FIG. 7 is a schematic block diagram of PLL circuit in accordance with the present invention.

FIG. 7 is a block diagram of one embodiment of a PLL circuit in accordance with the present invention. The PLL circuit includes a shift register circuit 1, a latch circuit 2, a comparison counter circuit 3, a load timing control circuit 21, a phase comparator 4, a charge pump 5, a loop filter 6, and a voltage controlled oscillator 7.

The shift register circuit 1 receives serial data SD in accordance with the rise of the clock signal CLK and provides, for example, a 10 bit parallel data signal for setting a frequency dividing ratio to the latch circuit 2. The latch circuit 2 receives and latches the parallel data in accordance with the rise of a latch signal LEC, and provides a frequency dividing ratio setting signal DLH to the comparison counter circuit 3. The comparison counter circuit 3 divides the frequency of an input signal IN on the basis of a frequency dividing ratio set by the frequency dividing ratio setting signal DLH and provides a frequency dividing signal LD to the phase comparator 4 and the load timing control circuit 21. The frequency dividing signal LD is also fed back to the comparison counter circuit 3 as a load signal.

The phase comparator 4 receives the frequency divided signal LD, as a comparison signal, and compares the signal LD with a reference signal REF from a reference frequency divider (not shown). The phase comparator 4 generates a pulse signal corresponding to the difference in frequency and the difference in phase to the charge pump 5. A pull-up side transistor or pull-down side transistor of the output stage of the charge pump 5 is turned on in accordance with the pulse signal from the phase comparator 4. The charge pump 5 is connected to a loop filter 6, on the subsequent stage as a load, and increases the output voltage as the pull-up side transistor goes on and decreases the output voltage as the pull-down side transistor goes on.

The loop filter 6 smooths the output signal of the charge pump 5, and outputs a smoothed output voltage signal to the voltage controlled oscillator (VCO) 7.

The voltage controlled oscillator 7 generates an output signal of a frequency corresponding to an output voltage of the loop filter 6. The VCO output signal is input to the comparison counter circuit 3 and the load timing control circuit 21 as the input signal IN.

The load timing control circuit 21 comprises a D flip flop circuit 22 and an AND gate 23. The flip flop circuit 22 has a data terminal D which receives the frequency dividing signal LD, a clock terminal CK which receives the input signal IN, and an output terminal Q which outputs an output signal LDT. The output signal LDT is an inverted signal of the latched data D. The AND gate 23 receives the output signal LDT from the flip flop circuit 22 and a latch signal LE, and generates the latch signal LEC.

Figure 8:
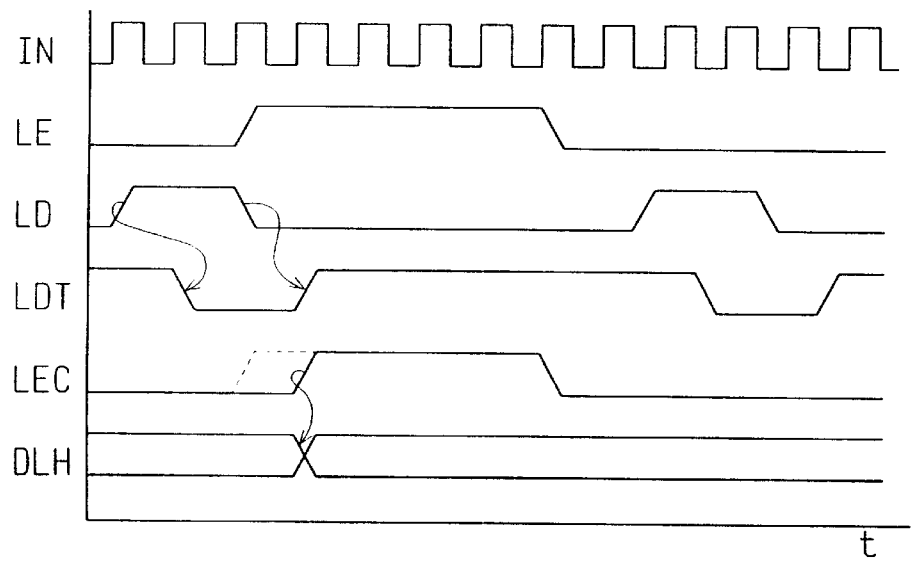
FIG. 8 is a timing chart showing the operation of the PLL circuit of FIG. 7.

The operation of the PLL circuit will now be described with reference to FIG. 8. When the frequency dividing signal LD provided to the flip-flop circuit 22 by the comparison counter circuit 3 is high, the flip-flop circuit 22 outputs the signal LDT, which corresponds to the frequency dividing signal LD, delayed for one cycle and inverted. The AND gate 23 performs a logical AND of the signal LDT and the latch signal LE, and generates the latch signal LEC. The latch signal LEC is high when the waveform LE is high, except for the time when the waveform LE is high that overlaps with when the waveform LDT low. Therefore, as shown in FIG. 8, if the rise time of the latch signal LE and the fall time of the frequency dividing signal LD overlap, the AND gate 23 outputs the latch signal LEC that is delayed from the rise of the latch signal LE.

The latch circuit 2 latches the parallel data from the shift register 1 in accordance with the rise of the latch signal LEC, and outputs a new frequency dividing ratio setting signal DLH. In response to the frequency dividing signal LD from the comparison counter circuit 3, the comparison counter circuit 3 receives the new frequency dividing ratio setting signal DLH and begins to count the input signal IN, in accordance with a newly set frequency dividing ratio.

The present invention reliably prevents the switching of the frequency dividing ratio setting signal DLH in accordance with the rise of the latch signal LEC from overlapping with the falling of the frequency dividing signal LD. Since the switching of the signal DLH is prevented from overlapping with the falling of the signal LD, the signal DLH is accurately received by the comparison counter circuit 3, which prevents the comparison counter circuit 3 from generating an erroneous signal. Even when the rise time of the latch signal LE overlaps with the falling of the frequency dividing signal LD, it is possible to switch the frequency dividing ratio setting signal DLH at a slightly delayed time from the concerned frequency dividing signal LD. Therefore, the time from the rise of the latch signal LE until the switching of the signal DLH is shorter than that of the conventional PLL circuit of the prior art discussed above.

When the high level output signal LDT overlaps with the rise time of the latch signal LE, the signal DLH is immediately switched in accordance with the rise of the latch signal LE. At this moment, if the frequency dividing signal LD is high, the frequency dividing ratio is immediately switched. Furthermore, if the frequency dividing signal LD is low when the signal DLH is switched, the frequency dividing ratio is switched in accordance with a next rise of a next frequency dividing signal LD. Accordingly, the frequency dividing ratio is changed swiftly in accordance with the rise of the latch signal LE, and therefore, the output signal frequency of the PLL circuit is switched at high speed.

The time length of the H level latch signal LE is not required to be more than one cycle of the frequency dividing signal LD. That is, the time length is required to cover only a time sufficient to operate the latch circuit 2. Preferably, the time length is a time length of the latch signal LEC generated by delaying the rise of the latch signal LE. Therefore, shortening the period of the latch signal LE shortens the switching period of the output signal frequency in the PLL circuit. Since only one latch circuit 2 is required to set the frequency dividing ratio, the circuit scale is reduced, compared to the second conventional example.

It should be apparent to those skilled in the art that the present invention may be embodied in many other specific forms without departing from the spirit or scope of the invention. For example, the flip flop circuit 22 generates the signal LDT by delaying and inverting the frequency dividing signal LD. However, odd stage inverter circuits may be designed to delay the frequency dividing signal LD for a specific time and to invert it. Therefore, the present examples and embodiments are to be considered as illustrative and not restrictive and the invention is not to be limited to the details given herein, but may be modified within the scope and equivalence of the appended claims.

What is claimed is:

1. A variable frequency divider comprising:
    a latch circuit for latching a parallel signal in accordance with a first latch signal to output a frequency dividing ratio setting signal;
    a comparison counter circuit, coupled to the latch circuit, for dividing an input signal and outputting a frequency dividing signal in accordance with a frequency dividing ratio based on the frequency dividing ratio setting signal, wherein the comparison counter circuit starts a frequency dividing operation in accordance with a new frequency dividing ratio based on the frequency dividing ratio setting signal in response to the output frequency dividing signal; and
    a timing control circuit, coupled to the comparison counter circuit, for receiving the frequency dividing signal and a second latch signal and for generating the first latch signal, wherein the timing control circuit stops outputting the first latch signal from a time at which the comparison counter circuit begins outputting the frequency dividing signal to a time at which the comparison counter circuit ends outputting the frequency dividing signal.

2. The variable frequency divider according to claim 1, wherein the timing control circuit comprises:
    a delay circuit for delaying the frequency dividing signal for a specific time and outputting a delayed frequency dividing signal; and
    a logic circuit, coupled to the delay circuit, for generating a logical output of the delayed frequency dividing signal and the second latch signal as the first latch signal.

3. The variable frequency divider according to claim 2, wherein the delay circuit comprises a D flip flop circuit, and the logic circuit comprises an AND gate.

4. A PLL circuit comprising:
    a phase comparator for comparing a phase of frequency dividing signal to a phase of a reference signal and outputting a phase comparison signal;
    a charge pump, coupled to the phase comparator, for converting the phase comparison signal into a voltage signal;
    a loop filter, coupled to the charge pump, for smoothing the voltage signal thereby generating a smoothed voltage signal;

a voltage controlled oscillator (VCO), coupled to the loop filter, for generating a frequency output signal corresponding to the smoothed output voltage signal; and a variable frequency divider, coupled between the phase comparator and the voltage controlled oscillator, for dividing a frequency of the frequency output signal in accordance with a set frequency dividing ratio to provide the frequency dividing signal to the phase comparator, the variable frequency divider including:

a latch circuit for latching a parallel signal in accordance with a first latch signal and outputting a frequency dividing ratio setting signal;

a comparison counter circuit, coupled to the latch circuit, for dividing the frequency output signal and outputting the frequency dividing signal in accordance with a frequency dividing ratio based on the frequency dividing ratio setting signal, wherein the comparison counter circuit starts a frequency dividing operation in accordance with a new frequency dividing ratio based on the frequency dividing ratio setting signal in response to the output frequency dividing signal; and a timing control circuit, coupled to the comparison counter circuit, for receiving the frequency dividing signal and a second latch signal and for generating the first latch signal, wherein the timing control circuit stops outputting the first latch signal from a time at which the comparison counter circuit begins outputting the frequency dividing signal to a time at which the comparison counter circuit ends outputting the frequency dividing signal.

5. The PLL circuit according to claim 4, wherein the timing control circuit comprises:

a delay circuit for delaying the frequency dividing signal for a specific time and outputting a delayed frequency dividing signal; and a logic circuit, coupled to the delay circuit, for generating a logical output of the delayed frequency dividing signal and the second latch signal as the first latch signal.

6. The PLL circuit according to claim 5, wherein the delay circuit comprises a D flip flop circuit, and the logic circuit comprises an AND gate.

7. A variable frequency divider comprising:

a latch circuit for latching a parallel signal in accordance with a first latch signal to output a frequency dividing ratio setting signal;

a comparison counter circuit, coupled to the latch circuit, for dividing an input signal and outputting a frequency dividing signal in accordance with a frequency dividing ratio based on the frequency dividing ratio setting signal, wherein the comparison counter circuit starts a frequency dividing operation in accordance with a new frequency dividing ratio based on the frequency dividing ratio setting signal in response to the output frequency dividing signal; and a timing control circuit, coupled to the comparison counter circuit, for receiving the frequency dividing signal and a second latch signal and for generating the first latch signal, wherein the timing control circuit delays the output of the first latch signal when a transition period of the frequency dividing signal and a transition period of the second latch signal overlap.

8. The variable frequency divider according to claim 7, wherein the timing control circuit comprises:

a delay circuit for delaying the frequency dividing signal for a specific time and outputting a delayed frequency dividing signal; and a logic circuit, coupled to the delay circuit, for generating a logical output of the delayed frequency dividing signal and the second latch signal as the first latch signal.

9. The variable frequency divider according to claim 8, wherein the delay circuit comprises a D flip flop circuit, and the logic circuit comprises an AND gate.

* * * * *